United States Patent [19]
Cho

[11] Patent Number: 5,894,245
[45] Date of Patent: Apr. 13, 1999

[54] OPERATIONAL AMPLIFIER

[75] Inventor: Young Kyun Cho, Seoul, Rep. of Korea

[73] Assignee: Samsung Electronics Co., Ltd., Suwon, Rep. of Korea

[21] Appl. No.: 08/967,326

[22] Filed: Oct. 21, 1997

[30] Foreign Application Priority Data

Oct. 23, 1996 [KR] Rep. of Korea ............... 96-47788

[51] Int. Cl.$^6$ .................................................. H03F 3/45
[52] U.S. Cl. .......................... 330/253; 330/255; 330/261; 330/311
[58] Field of Search ........................... 330/253, 255, 330/311, 252, 295, 261

[56] References Cited

U.S. PATENT DOCUMENTS 5,177,450  1/1993  Lee et al. ........................... 330/253

Primary Examiner—Robert Pascal
Assistant Examiner—Patricia Nguyen
Attorney, Agent, or Firm—Jones & Volentine, L.L.P.

[57] ABSTRACT

An operational amplifier includes a differential amplifier portion for amplifying input signals and having an amplification path defined by plural series connected first switching devices extending between a supply and a ground, each of said first switching devices having a control input. The operational amplifier further includes an output portion for outputting signals amplified by the amplifier portion and having an output path defined by plural series connected switching devices extending between the supply and the ground, each of the switching devices having a control input and each respectively connected to the control input of said amplification portion. A resistance of the output path is less than a resistance of the amplification path such that a current flow through the amplification path is less than that of the output path. In this manner, power consumption is reduced.

8 Claims, 3 Drawing Sheets

OPERATIONAL AMPLIFIER

BACKGROUND OF THE INVENTION

The present invention relates to an operational amplifier, and more particularly, to an operational amplifier capable of reducing power consumption. Further, the present invention relates to a cascode operational amp which consumes a small amount of current.

The operational amplifier (OP amp) has been widely used in an analog applications. A general operational amplifier is designed on the basis of a two-stage differential amplifier. In a general two-stage differential amplifier, gain is high, but the frequency characteristics are degraded. In order to improve frequency characteristics, a folded cascode OP amp is often used. However, while the cascode OP amp has relatively good frequency characteristics, it suffers the disadvantage of high current consumption.

FIG. 1 is a circuit diagram of a conventional OP amp 1. In FIG. 1, the structure of the OP amp 1 is functionally divided into an input portion 10, a bias portion 20, an amplifying portion 30 and an outputting portion 40. The bias portion 20 provides a bias necessary for operating the input portion 10, the amplifying portion 30 and the outputting portion 40. The amplifying portion 30 amplifies signals ni and pi which are input from external sources.

The bias portion 20 is connected to a power supply VDDA through its source, and has a structure made up of a series connection of a first PMOS transistor 22 whose gate and drain are connected, a resistor 24, and a first NMOS transistor 26 whose gate and drain are connected and whose source is connected to a ground voltage VSSA. The first PMOS and NMOS transistors 22 and 26 act as a forward diode with respect to the VDDA.

The input portion 10 includes second NMOS and PMOS transistors 11 and 15 connected to a first input signal ni through their gates, third NMOS and PMOS transistors 12 and 16 connected to a second input signal pi through their gates, a fourth NMOS transistor 13 whose drain is commonly connected to the sources of the second and third NMOS transistors 11 and 12, whose gate is connected to that of the first NMOS transistor 26, and whose source is connected to the VSSA, and a fourth PMOS transistor 17 whose drain is commonly connected to the sources of the second and third PMOS transistors 15 and 16, whose gate is connected to that of the first PMOS transistor 22, and whose source is connected to the VDDA.

The amplifying portion 30 includes a fifth PMOS transistor 32 whose source is connected to the VDDA and whose gate is connected to that of the first PMOS transistor 22, a sixth PMOS transistor 34 whose source is connected to the drain of the fifth PMOS transistor 32 and whose gate and drain are connected to each other, a fifth NMOS transistor 36 whose drain and gate are connected to the drain of the sixth PMOS transistor 34, and a sixth NMOS transistor 38 whose drain is connected to the source of the fifth NMOS transistor 36, whose gate is connected to that of the first NMOS transistor 26, and whose source is connected to the VSSA.

The output portion 40 includes a seventh PMOS transistor 42 whose source is connected to the VDDA and whose gate is connected to that of the first PMOS transistor 22, an eighth transistor PMOS 44 whose source is connected to the drain of the seventh PMOS transistor 42 and whose gate is connected to that of the sixth PMOS transistor 34, a seventh NMOS transistor 46 whose drain is connected to the drain of the eighth PMOS transistor 44 and whose gate is connected to the gate of the fifth NMOS transistor 36, and an eighth NMOS transistor 48 whose drain is connected to the source of the seventh NMOS transistor 46, whose gate is connected to that of the first NMOS transistor 26, and whose source is connected to the VSSA. The eighth PMOS transistor 44 outputs an output signal Vout through its drain.

The amplifying portion 30 and the output portion 40 are symmetrical with each other in that a one-to-one ratio of elements exists. That is, the fifth and seventh PMOS transistors 32 and 42, the sixth and eighth PMOS transistors 34 and 44, the fifth and seventh NMOS transistors 36 and 46, and the sixth and eighth NMOS transistors 38 and 48 are symmetrically connected to each other. Thus, the amplifying portion 30 and the output portion 40 the are the same with respect to the flow of current. In order to improve the gain and the frequency characteristics of the OP amp 1, a large amount of current should flow in the output portion 40. Accordingly, a large amount of current also flows in the amplifying portion 30. However, in an actual case, since only the current flowing in the output portion 40 is necessary to control an output signal of the OP amp 1, the flow of much current in the amplifying portion 30 results in the unnecessary consumption of current. Such an OP amp 1 is not appropriate for pursuing low-power consuming products.

In the conventional OP amp 1 described above, there exists a drawback in that substantial current flows in the amplifying portion 30 such that a large amount of power is consumed thereby.

SUMMARY OF THE INVENTION

Accordingly, it is an object of the present invention to provide an operational amplifier which consumes a minimal amount of power.

To accomplish the above object, there is provided an operational amplifier according to the invention which includes a differential amplifier portion for amplifying input signals and having an amplification path defined by plural series connected first switching devices extending between a supply and a ground, each of said first switching devices having a control input; and an output portion for outputting signals amplified by said amplifier portion and having an output path defined by plural series connected switching devices extending between the supply and the ground, each of the switching devices having a control input and each respectively connected to the control input of said amplification portion; wherein a resistance of said output path is less than a resistance of said amplification path such that a current flow through said amplification path is less than that of said output path.

The operational amplifier according to the invention may further include a biasing portion operatively connected to said differential amplifying portion and to said output portion for biasing said differential amplifier portion and said output portion.

The operational amplifier according to the invention may still further include an input portion operatively connected to said biasing portion, said differential amplifier portion, and said output portion, for receiving a plurality of externally supplied signals.

The operational amplifier of the present invention reduces the overall power consumption.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 2:
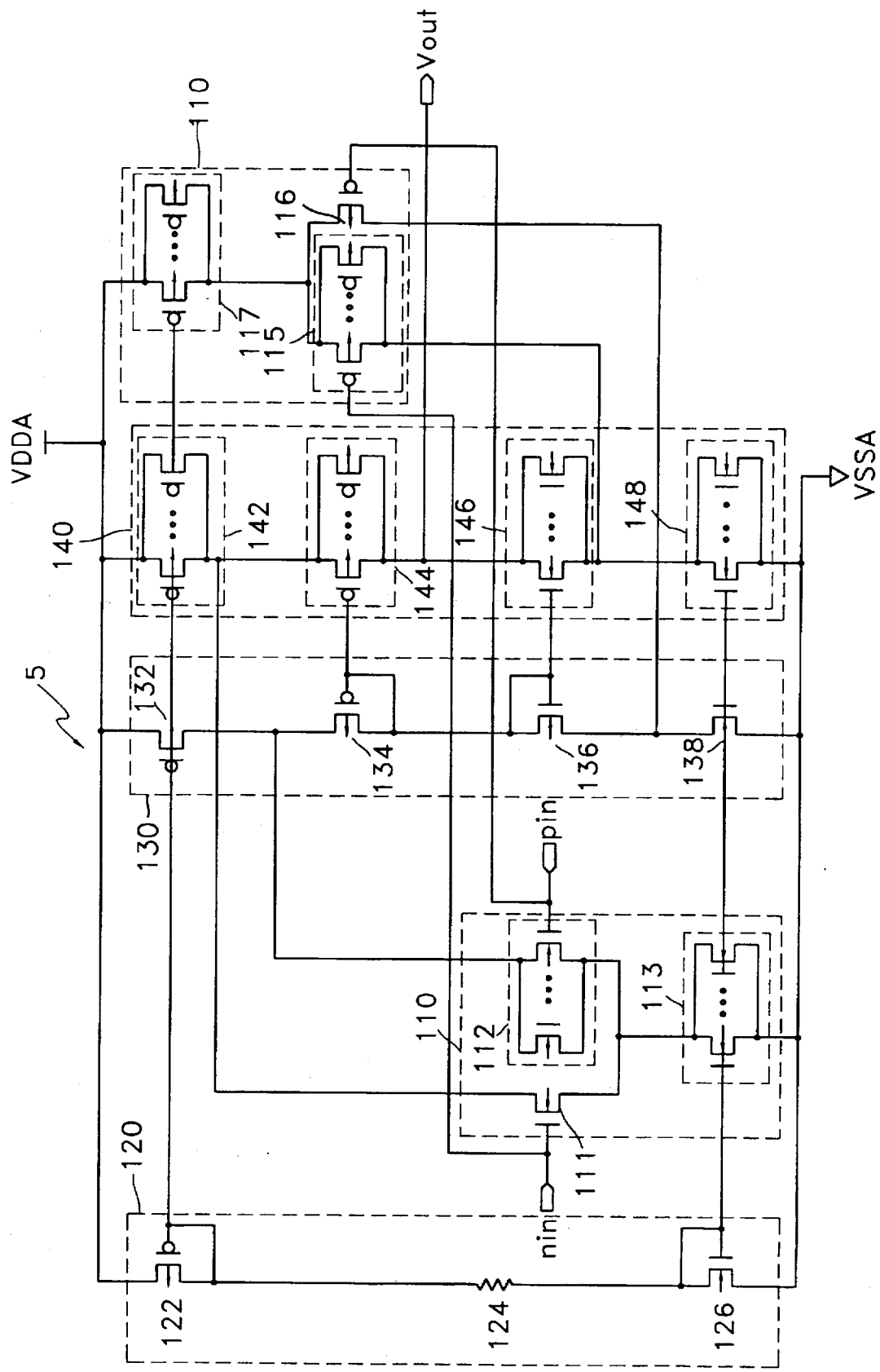
FIG. 2 is a circuit diagram of an operational amplifier according to the present invention.

Referring to FIG. 2, an operational amplifier 5 is functionally divided into an input portion 110, a bias portion 120, an amplifying portion 130, and an output portion 140. The bias portion 120 provides a bias necessary for operating the input portion 110 and the amplifying portion 130. The amplifying portion 130 amplifies signals nin and pin input from external sources.

The bias portion 120 includes a first PMOS transistor 122 whose source is connected to a power supply VDDA and whose gate and drain are connected to each other. The bias portion further includes a resistor 124 having one end connected to the drain of the first PMOS transistor 122. The other resistor end is connected to the commonly connected drain and gate of first NMOS transistor 126. The source of the first NMOS 126 is connected to a ground voltage VSSA. The first PMOS and NMOS transistors 122 and 126 act as a forward diode with respect to the VDDA.

The input portion 110 includes a second NMOS transistor 111 and a first PMOS transistor group 115 commonly connected to a first input signal nin through their respective gates; a first NMOS transistor group 112 and a second PMOS transistor 116 commonly connected to a second input signal pin through their respective gates; a second NMOS transistor group 113, whose drains are commonly connected to the sources of the second NMOS transistor 111 and the source of the first NMOS transistor group 112, whose gates are commonly connected to that of the first NMOS transistor 126, and whose sources are commonly connected to the VSSA; and a second PMOS transistor group 117 whose drains are commonly connected to the sources of the first PMOS transistor group 115 and the sources of the second PMOS transistor group 116, whose gates are commonly connected to that of the first PMOS transistor 122, and whose sources are commonly connected to the VDDA.

The amplifying portion 130 includes a third PMOS transistor 132 whose source is connected to the VDDA and whose gate is connected to that of the first PMOS transistor 122; a fourth PMOS transistor 134 whose source is connected to the drain of the third PMOS transistor 132 and whose gate and drain are connected to each other; a third NMOS transistor 136 whose drain and gate are connected to the drain of the fourth PMOS transistor 134; and a fourth NMOS transistor 138 whose drain is connected to the source of the third NMOS transistor 136, whose gate is connected to that of the first NMOS transistor 126, and whose source is connected to the VSSA. The fourth PMOS transistor 134 and the third NMOS transistor 136 are connected in a push-pull structure so that power efficiency is improved.

The output portion 140 includes a third PMOS transistor group 142 whose sources are connected to the VDDA and whose gates are connected to the gate of the third PMOS transistor 132; a fourth PMOS transistor group 144 whose sources are connected to the drains of the third PMOS transistor group 142 and whose gates are connected to the gate of the fourth PMOS transistor 134; a third NMOS transistor group 146 whose drains are connected to those of the fourth PMOS transistor group 144 and whose gates are connected to the gate of the third NMOS transistor 136; and a fourth NMOS transistor group 148 whose drains are connected to the sources of the third NMOS transistor group 146, whose gates are connected to the gate of the fourth NMOS transistor 138, and whose sources are connected to the VSSA. The drains of the fourth PMOS transistor group 144 output an output signal Vout.

The PMOS transistors in the third and fourth PMOS transistor groups 142 and 144 have the same size as the third and fourth PMOS transistors 132 and 134, respectively. Each group includes a structure in which ten PMOS transistors are connected in parallel with each other. Also, the NMOS transistors in the third and fourth NMOS transistor groups 146 and 148 have the same size as the third and fourth NMOS transistors 136 and 138, respectively, each group having a structure in which ten NMOS transistors are connected in parallel with each other.

The operation of the operational amplifier 5 of FIG. 2 will now be described. When the VDDA is applied to the operational amplifier 5 in an initial state, current flows through the first PMOS transistor 122, the resistor 124, and the first NMOS transistor 126. Here, the first PMOS and NMOS transistors 122 and 126 act as a forward diode with respect to the VDDA. Accordingly, when the VDDA exceeds approximately 0.7V which corresponds to a forward threshold voltage of a diode, the first PMOS and NMOS transistors 122 and 126 are turned on so that power supply current flows.

When the power supply current flows through the first PMOS transistor 122, same current flows in the second PMOS transistor group 117, the third PMOS transistor 132 and the third PMOS transistor group 142. Also, the power supply current flows through the first NMOS transistor 126 such that the second NMOS transistor group 113, the fourth NMOS transistor 138 and the fourth NMOS transistor group 148 are also turned on. When the second and third PMOS transistor groups 117 and 142, the third PMOS transistor 132, the second and fourth NMOS transistor groups 113 and 148, and the fourth NMOS transistor 138 are turned on, the input portion 110, the amplifying portion 130 and the output portion 140 enter an operation standby state, and when the signals nin and pin are input, immediately operate to output an output signal Vout.

As described above, when the amplifying portion 130 and the output portion 140 operate, an extremely small amount of current, compared to current flowing in the output portion 140, flows in the amplifying portion 130. That is because the output portion 140 includes the third and fourth PMOS transistor groups 142 and 144 and the third and fourth NMOS transistor groups 146 and 148 wherein ten transistors are interconnected in each group, whereas the amplifying portion 130 includes the third and fourth PMOS transistors 132 and 134 and the third and fourth NMOS transistors 136 and 138. In more detail, the current flowing in the amplifying portion 130 is half as much as the current flowing in the output portion 140 so that power consumption is reduced by as much as the difference between the two current amounts. Furthermore, as the current flowing in the amplifying portion 130 is increased, the gain of the operational amplifier 5 is increased, and the frequency characteristic thereof is maintained as in the conventional art.

Figure 1:
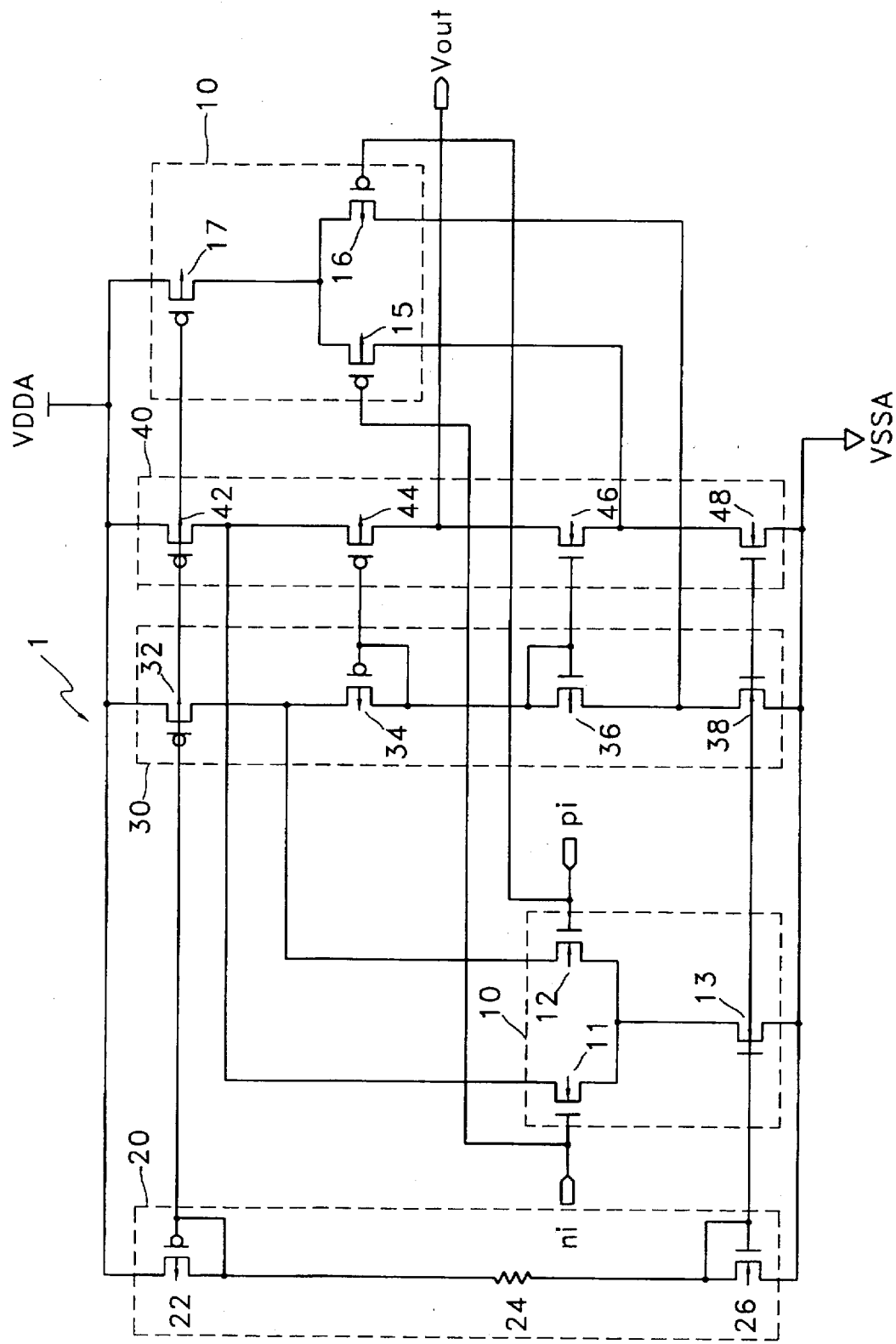
FIG. 1 is a circuit diagram of a conventional operational amplifier.
Figure 3A:
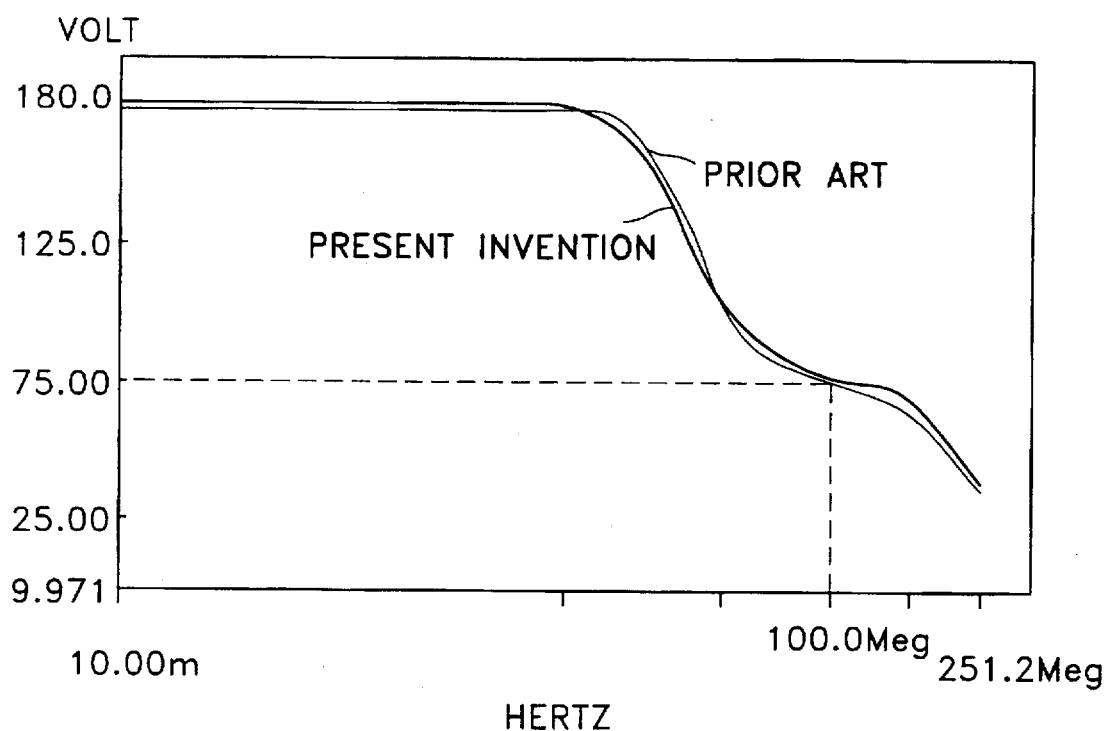
FIGS. 3A and 3B are graphs showing simulation results of the frequency characteristics and the output currents of FIGS. 1 and 2, respectively.
Figure 3B:
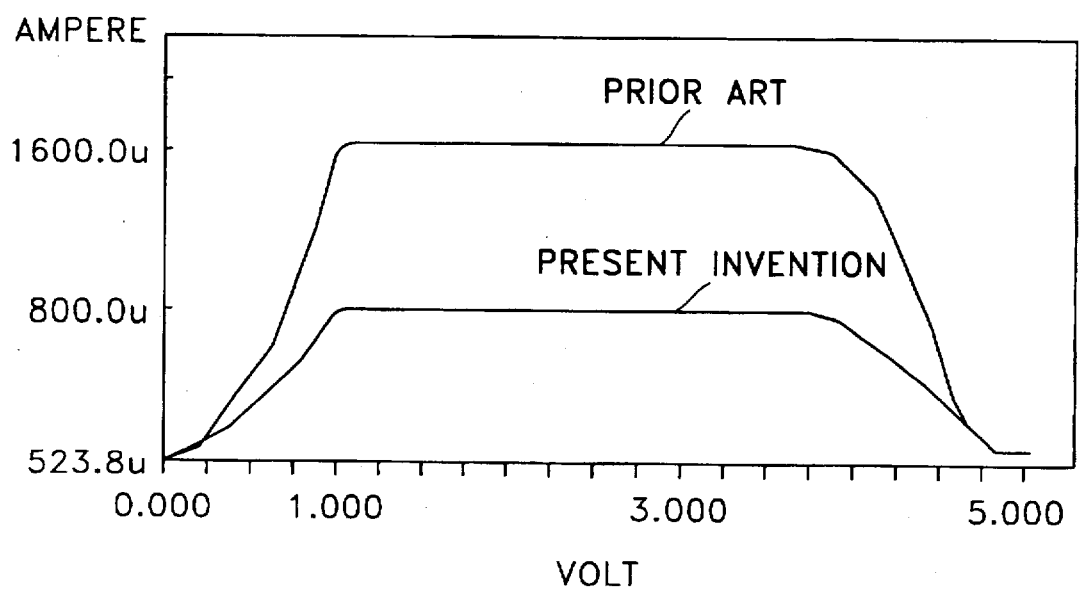

FIGS. 3A and 3B are graphs showing the simulation results of the frequency characteristics and the output currents of FIGS. 1 and 2, respectively. As can be seen from FIG. 3A, the frequency characteristics of the conventional operational amplifier 1 are similar to that of the operational amplifier 5 according to the present invention. As can be seen from FIG. 3B, the output current of the conventional operational amplifier 1 is 1600 uA while that of the operational amplifier 5 according to the present invention is about 800 uA, which is half as much as the output current value of the conventional operational amplifier 1.

According to the present invention as described above, the power consumption of the operational amplifier is reduced, and the frequency characteristics are maintained as in the conventional art by providing plural transistors in the output portion corresponding to those in the amplifying portion.

The present invention is not limited to the above embodiment, and it is apparent that various modifications may be effected by those skilled in the art within the technical spirit of the present invention.

What is claimed is:

1. An operational amplifier including:
   a differential amplifier portion for amplifying input signals and having an amplification path defined by plural series connected first switching devices extending between a supply and a ground, each of said first switching devices having a control input; and
   an output portion for outputting signals amplified by said amplifier portion and having an output path defined by plural series connected switching devices extending between the supply and the ground, each of the switching devices having a control input and each respectively connected to the control input of said amplification path;
   wherein a resistance of said output path is less than a resistance of said amplification path such that a current flow through said amplification path is less than that of said output path.

2. The operational amplifier according to claim 1, further comprising a biasing portion operatively connected to said differential amplifying portion and to said output portion for biasing said differential amplifier portion and said output portion.

3. The operational amplifier according to claim 2, further comprising an input portion operatively connected to said biasing portion, said differential amplifier portion, and said output portion, for receiving a plurality of externally supplied signals.

4. An operational amplifier, comprising:
   an input portion which receives first input signals and outputs first output signals corresponding to the first input signals;
   an amplifying portion, operatively coupled to said input portion, which amplifies the first output signals to generate second output signals;
   an output portion, operatively coupled to said input and amplifying portions, which receives and outputs the second output signals; and
   a bias portion operatively coupled to said input portion, said amplifying portion and said output portion, which biases said input portion, said amplifying portion and said output portion;
   wherein a current flow through said amplifying portion is less than a current flow through said output portion.

5. The operational amplifier according to claim 4, wherein said bias portion includes:
   a PMOS transistor, a resistor, and an NMOS transistor, said PMOS and NMOS transistors each having a source, a drain and a gate;
   wherein said source of said PMOS transistor is connected to a power supply, and said gate and drain of said PMOS transistor are connected together;
   wherein said resistor is connected between said drain of said PMOS transistor and said drain of said NMOS transistor; and
   wherein said drain and said gate of said NMOS transistor are connected together.

6. The operational amplifier according to claim 4, wherein said input portion comprises:
   an NMOS transistor and a PMOS transistor each having a source, a gate, and a drain;
   first and second NMOS transistor groups and first and second PMOS transistor groups each having a plurality of parallel connected transistors, each of said transistors having a source, a gate, and a drain;
   wherein gate of said NMOS transistor and said gates of said first PMOS transistor group are operatively connected and receive a first input signal;
   wherein said gate of said first NMOS transistor group and said gate of said PMOS transistor are operatively connected and receive a second input signal;
   wherein said second NMOS transistor group is connected in series to both said second NMOS transistor and said first NMOS transistor group; and
   wherein said second PMOS transistor group is serially connected to both said said first PMOS transistor group and said PMOS transistor.

7. The operational amplifier according to claim 4, wherein said amplifier portion comprises:
   first and second PMOS transistors connected in series with one another and each having a source, a drain, and a gate; and
   first and second NMOS transistors connected in series with one another and in series with said first and second PMOS transistors and each having a source, a drain, and a gate.

8. The operational amplifier according to claim 4, wherein said output portion includes:
   first and second PMOS transistor groups connected in series with one another, each of said first and second PMOS transistor groups having a plurality of transistors connected in parallel; and
   first and second NMOS transistor groups connected in series with one another and in series with said first and second PMOS transistor groups, each of said first and second NMOS transistor groups having a plurality of transistors connected in parallel.

* * * * *